United States Patent [19]
Masuda et al.

[11] Patent Number: 4,560,890
[45] Date of Patent: Dec. 24, 1985

[54] AUTOZEROED COMPARATOR

[75] Inventors: Eiji Masuda, Kawasaki; Kenji Matsuo, Yokohama; Yasuhiko Fujita, Tokyo, all of Japan

[73] Assignee: Tokyo Shibaura Denki Kabushiki Kaisha, Japan

[21] Appl. No.: 526,821

[22] Filed: Aug. 26, 1983

[30] Foreign Application Priority Data

Aug. 31, 1982 [JP] Japan .................................. 57-150983

[51] Int. Cl.⁴ ............................................ H03K 5/24
[52] U.S. Cl. .................................. 307/355; 307/352; 328/151
[58] Field of Search ............... 307/350, 352, 353, 355, 307/356, 358, 362; 328/151

[56] References Cited

U.S. PATENT DOCUMENTS

| | | | |
|---|---|---|---|
| 3,676,702 | 7/1972 | McGrogan, Jr. | 307/355 |
| 4,191,900 | 3/1980 | Redfern et al. | 307/355 |
| 4,211,942 | 7/1980 | Aoki et al. | 307/356 |

OTHER PUBLICATIONS

Dingwall, "Monolithic Expandable 6 Bit 20 MHz CMOS/SOS A/D Converter," IEEE J. Solid-State Circuits, vol. SC-14, pp. 926-932.
Yee et al., "A 1mV MOS Comparator," IEEE Journal of Solid State Circuits, vol. SC-13, No. 3, Jun. 1978.

Primary Examiner—John Zazworsky
Attorney, Agent, or Firm—Finnegan, Henderson, Farabow, Garrett & Dunner

[57] ABSTRACT

An input voltage sampler samples the difference between two input voltages. An alternate switch switches at a period which is longer than twice the sampling period. The voltage difference is supplied through the alternate switch to a plurality of amplifiers. Prior to starting the amplifying operation, operating point setting circuits set the input level to the amplifiers at the operating point.

6 Claims, 15 Drawing Figures

AUTOZEROED COMPARATOR

BACKGROUND OF THE INVENTION

The present invention relates to an autozeroed comparator suitably adapted for high-speed sampling.

In a conventional parallel comparing A/D converter, a number of comparators for discriminating quantization levels are arranged in parallel with each other. The comparators simultaneously compare the input signals, and the converter produces a suitable code in accordance with outputs from these comparators. In an A/D converter of this type, each comparator comprises a differential amplifier such as an operational amplifier. However, if such operational amplifiers are used, errors are caused by an offset voltage and an offset current.

Figure 1:
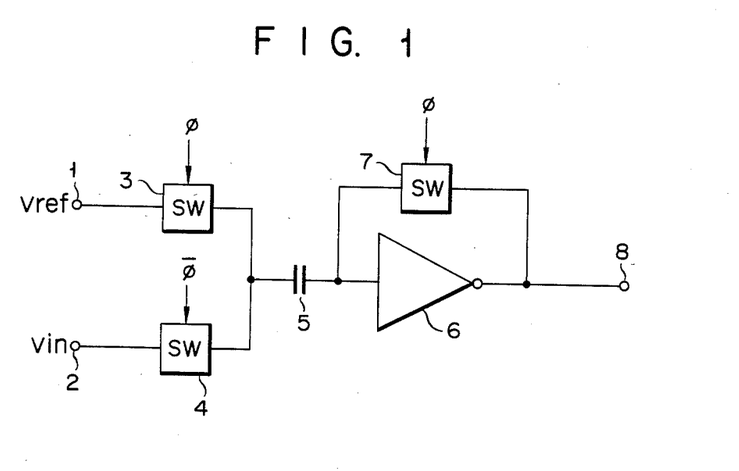
FIG. 1 is a block diagram showing an example of a conventional autozeroed comparator.

In view of this problem, a high-speed and high-precision autozeroed comparator as shown in FIG. 1 exists, which can, theoretically, avoid offset error. In a comparator of this type, a reference voltage Vref is supplied to a first input terminal 1, and an input signal Vin to be compared therewith is supplied to a second input terminal 2. The first and second input terminals 1 and 2 are controlled by a clock signal $\phi$ and an inverted signal $\bar{\phi}$ thereof, respectively. For this purpose, the first and second input terminals 1 and 2 are connected in parallel with each other through first and second switches 3 and 4 each comprising an FET analog switch and are then connected to one terminal of a capacitor 5. The other terminal of the capacitor 5 is connected to the input terminal of an inverting amplifier 6. A third switch 7 is arranged between the input and output terminals of the inverting amplifier 6 and is controlled by the clock signal $\phi$. The output terminal of the inverting amplifier 6 is connected to an output terminal 8.

Figure 2:
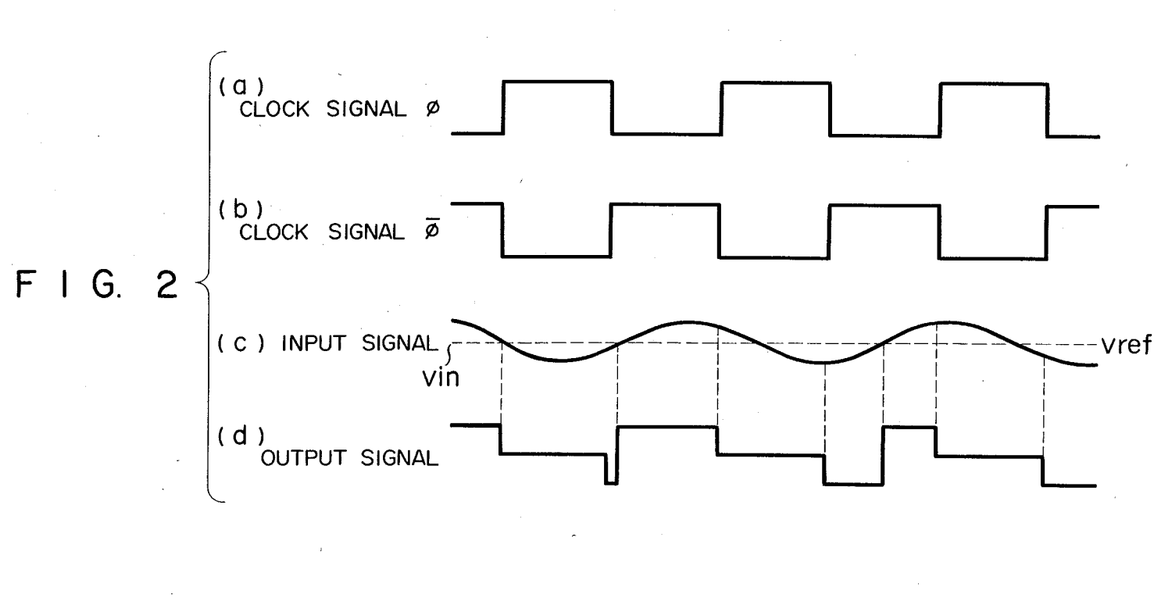
FIG. 2 shows timing charts (a) to (d) for explaining the mode of operation of the comparator shown in FIG. 1.
Figure 3:
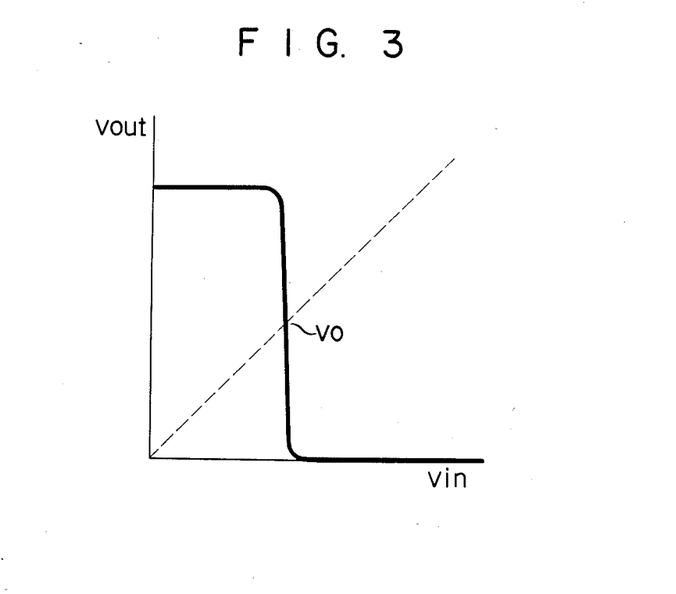
FIG. 3 is a graph showing an input/output characteristic curve for explaining the operating point of an inverter of the comparator shown in FIG. 1.

With the comparator as described above, as indicated by the timing charts in FIG. 2, during the "H" (high) level of the clock signal $\phi$ ((a) in FIG. 2), the first and third switches 3 and 7 are turned on and the second switch 2 is turned off to short-circuit the input and output terminals of the inverting amplifier 6. In this manner, a voltage between the input and output terminals of the inverting amplifier 6 reaches a threshold voltage Vthr, that is, an operating voltage as a reference of operation. In the input/output characteristic curve (input voltage Vin versus output voltage Vout) of the inverter as shown in FIG. 3, the operating voltage corresponds to a voltage V0 at which the input and output voltages are equal to each other (Vin=Vout). At this time, the reference voltage Vref is applied to the input side of the capacitor 5. During the "H" level of the clock signal $\bar{\phi}$ ((b) in FIG. 2), the first and third switches 3 and 7 are turned off and the second switch 4 is turned on. Thus, the input signal Vin is supplied to the input side of the capacitor 5. Accordingly, the input voltage to the inverting amplifier 6 changes from the threshold voltage Vthr to the voltage difference between the reference voltage Vref and the input signal Vin.

If it is assumed that the inverting amplifier 6 has a high input impedance and the capacitor 5 does not leak any charge, the capacitor 5 will store a constant amount of charge. When the potential at the input side of the capacitor 5 changes from Vref to Vin, the potential at the output side thereof changes from the threshold voltage Vthr to Vthr+(Vref−Vin). Such a change in the input voltage to the inverting amplifier 6 can be produced from the output terminal 8 after being multiplied by the gain of the inverting amplifier 6.

A plurality of comparators each having the configuration described above are arranged; an input voltage is commonly supplied to one input terminal of each of the comparators while voltages weighted by different weighting coefficients are supplied to the other input terminal of each of the comparators. A comparison output from each comparator is supplied to a decoder for decoding. Then, an analog-to-digital converter (to be referred to as an A/DC hereinafter) is obtained which converts an analog value supplied as an input signal to a digital signal.

When a video signal having a frequency of about 3.58 MHz is to be converted to a digital signal using such an A/DC, the sampling frequency must be at least two times and preferably four times, i.e., 15 MHz, the original frequency so as to provide a practically acceptable conversion precision, from the known sampling theorem.

When a comparator, the most important part of the A/DC, has the circuit configuration as shown in FIG. 1 and a general bulk CMOS element is used, a required conversion speed cannot be obtained. When a comparator having the circuit configuration as shown in FIG. 1 is integrated by the currently available micropatterning technique, the maximum conversion speed attainable is about 10 MHz samples per second.

If the rate of change over time of the gain of an amplifying means of such an A/DC is given as a, supply of a voltage difference Va−Vb between input voltages Va and Vb to the input terminals produces an output voltage of (Va−Vb)×a×t where t is time from the start of amplifying operation. Meanwhile, the rate of change a of the gain of such an amplifying means decreases over time. When a product a·t of the rate of change a and time t reaches saturation at a certain time point, the output voltage remains constant thereafter.

In an amplifying means used in an A/DC for digital conversion of a signal having a high frequency such as a video signal, the amplifying time is as short as 10 ns to 100 ns. For this reason, the sampling period of the amplifying means ends before the output reaches saturation level. When the sampling period is short, as in this case, the gain of the amplifying means can be considered to be substantially proportional to the amplifying period. Thus, when the amplifying period is doubled, the effective gain is substantially doubled. However, when the amplifying period is doubled, the sampling frequency is rendered substantially half the original frequency and conversion speed is also reduced to substantially half the original speed. This means that digital conversion of a signal having a high frequency such as a video signal cannot be performed with high precision.

A comparator also exists with the circuit configuration shown in FIG. 1 using a CMOS element of SOS (silicon on sapphire) structure and which can perform high-speed conversion of 20 MHz samples per second. However, such a comparator results in high cost in both the manufacture process and materials and cannot be used in cases where cost is of prime importance.

SUMMARY OF THE INVENTION

It is an object of the present invention to provide an autozeroed comparator which uses a bulk manufactured CMOS element and which can achieve a conversion speed which is more than twice that of a conventional comparator.

It is another object of the present invention to provide an autozeroed comparator which is capable of high-speed operation and which is inexpensive.

It is still another object of the present invention to provide an autozeroed comparator which is particularly suitable for formation into an IC circuit using a bulk CMOS element.

In order to achieve the above and other objects of the present invention, there is provided an autozeroed comparator which is capable of high-speed operation at speeds more than twice that of conventional comparators, which is suitable for high-speed conversion of an analog signal having a high frequency by an integrated A/DC, and which is inexpensive.

DETAILED DESCRIPTION OF THE PREFERRED EMBODIMENTS

Figure 4:
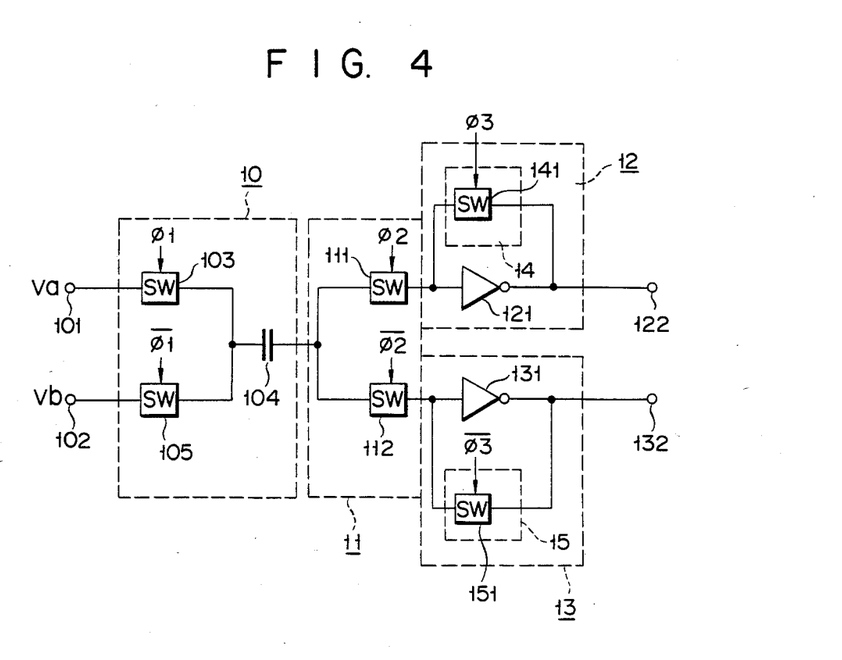
FIG. 4 is a block diagram of an autozeroed comparator according to an embodiment of the present invention.

An embodiment of the present invention will now be described with reference to the accompanying drawings. FIG. 4 is a block diagram of an autozeroed comparator according to an embodiment of the present invention. A first input terminal 101 receives an input voltage Va, and a second input terminal 102 receives another input voltage Vb. The first input terminal 101 is connected to one terminal of a capacitor 104 through a first switch 103 controlled by a first clock signal $\phi 1$. The second input terminal 102 is also connected to one terminal of the capacitor 104 through a second switch 105 controlled by an inverted signal $\phi 1$ of the clock signal $\phi 1$. The first and second switches 103 and 105 and the capacitor 104 together constitute an input voltage sampling means 10.

An output from the input voltage sampling means 10, that is, the potential at the other terminal of the capacitor 104 is alternately supplied to first and second amplifying means 12 and 13 through an alternate switch means 11. The alternate switch means 11 has a third switch 111 which is controlled by a second clock signal $\phi 2$ for supplying the potential at the other terminal of the capacitor 104 to the first amplifying means 12. The alternate switch means 11 also has a fourth switch 112 which is controlled by an inverted signal $\phi 2$ for supplying the potential at the other terminal of the capacitor 104 to the second amplifying means 13.

The first amplifying means 12 has an inverter 121, output from which is supplied to a first output terminal 122. The second amplifying means 13 similarly has an inverter 131, output from which is supplied to a second output terminal 132. An operating point setting means 14 comprising a fifth switch 141 is inserted between the input and output terminals of the inverter 121 and is controlled by a third clock signal $\phi 3$. Another operating point setting means 15 comprising a sixth switch 151 is inserted between the input and output terminals of the inverter 131 and is controlled by an inverted signal $\phi 3$ of the third clock signal $\phi 3$.

Figure 5A:
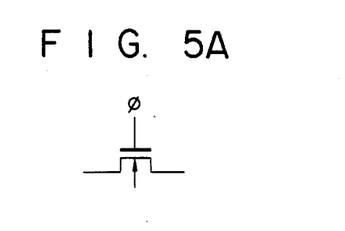
FIGS. 5A and 5B are views showing switches used in the autozeroed comparator shown in FIG. 4, respectively.
Figure 5B:
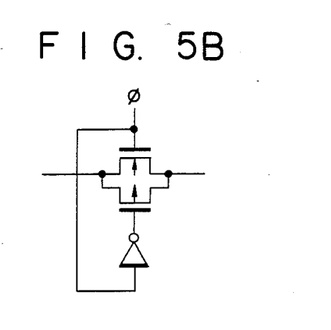

Each switch may comprise an analog switch using a single n-type MOSFET as shown in FIG. 5A or a transfer gate in which n- and p-type MOSFETs are connected in parallel with each other as shown in FIG. 5B.

With the comparator as described above, it is assumed that the switches 103, 105, 111, 112, 141 and 151 are turned on by a clock signal at logic level "H" and turned off by a clock signal at logic level "L".

Figure 6:
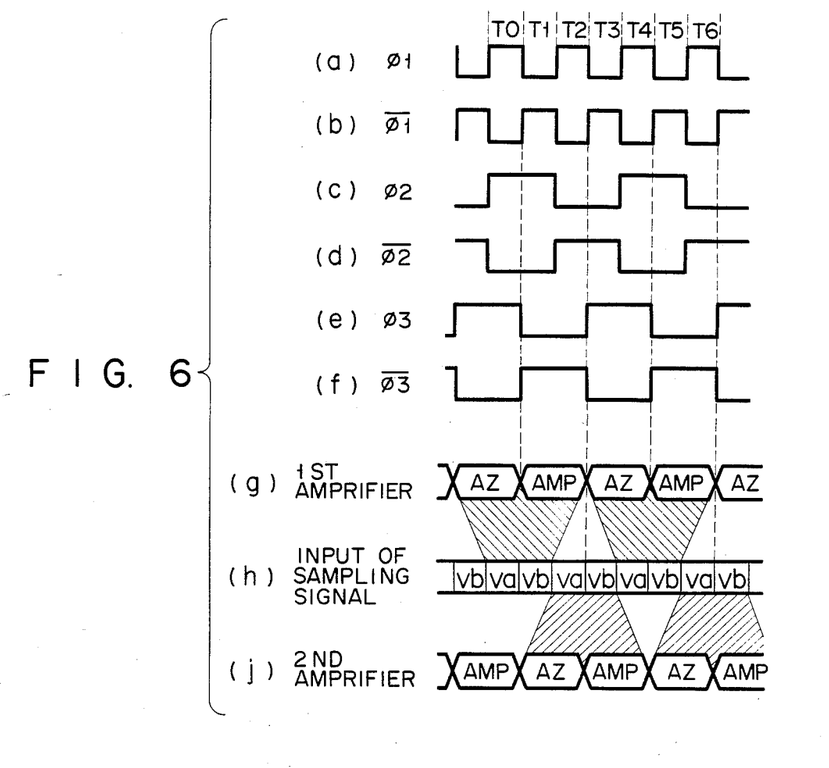
FIG. 6 shows timing charts (a) to (j) for explaining the mode of operation of the comparator shown in FIG. 4.

As shown in the timing charts in FIG. 6, the second clock signal $\phi 2$ is a signal synchronous with the first clock signal $\phi 1$ but at one-half of the frequency thereof. The third clock signal $\phi 3$ has a phase delay of 90° with respect to the second clock signal $\phi 2$. Accordingly, in period T1, the second, third and sixth switches 105, 111 and 151 are turned on to sample the input voltage Vb. In period T1, the voltage difference (Va−Vb) between the voltage Vb and the input voltage Va sampled in period T0 is amplified by the inverter 121 through the third switch 111. In this period T1, the sixth switch 151 is turned on, and the second amplifying means 13 performs an autozero operation by means of the operating point setting means 15. In the next period T2, the first, fourth, and sixth switches 103, 112 and 151 are turned on, the input voltage Va is sampled, and the second amplifying means 13 continues the autozero operation. In the period T2, the third switch 111 is OFF, so the first amplifying means 12 continues operating. Thus, during period T2, the input voltage Va is sampled and the first amplifying means 12 continues the amplifying operation in succession to that during period T1. Therefore, a sufficiently long amplifying period can be obtained. In the next period T3, the second switch 105 is turned on and the input voltage Vb is sampled. The fourth switch 112 is turned on to supply the voltage difference (Va−Vb) to the second amplifying means 13. When the fifth switch 141 is turned on, the first amplifying means 12 performs an autozero operation and the second amplifying means 13 operates. During the next period T4, the first, third and fifth switches 103, 111 and 141 are turned on to sample the input voltage Va. The first and second amplifying means 12 and 13 continue the autozero operation and amplifying operation, respectively. In this manner, the second amplifying means 13 can also continue operating in succession to the period T3, thereby providing a sufficiently long amplifying period. Thereafter, a similar operation to that in the periods T1 to T4 is repeated in periods T5, T6 and so on.

In this manner, the sampling input signal ((h) in FIG. 6) is selected by the first clock signal ((a) and (b) in FIG. 6). Switching of the amplifying operation (AMP) and of the autozero operation (AZ) of the first and second amplifying means 12 and 13 is performed by the third clock signal ((e) and (f) in FIG. 6). Since two amplifying means are alternately operated, a practical amplifying period can be doubled with a constant sampling period. Accordingly the result is a sampling period half that of the conventional case producing the same gain. The comparator of the present invention can thus operate at a high speed.

Figure 7:
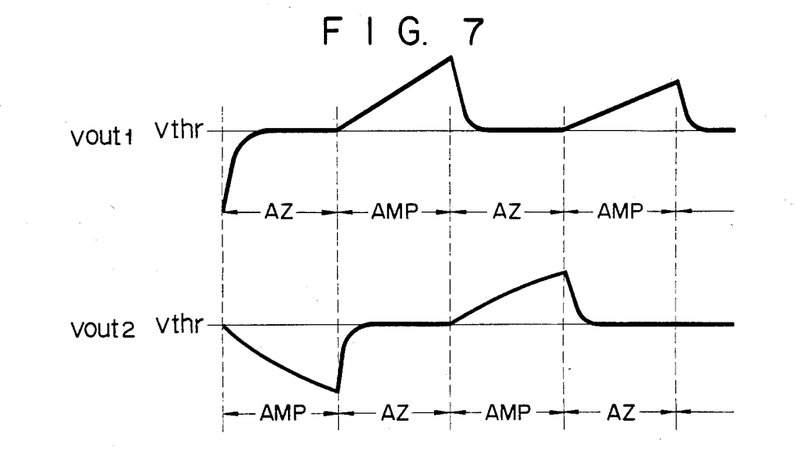
FIG. 7 shows timing charts showing the mode of operation of the comparator shown in FIG. 4 together with the changes in the output therefrom.

FIG. 7 shows changes in output voltages Vout1 and Vout2 at output terminals 122 and 132, respectively. In each case, the output potential reaches a threshold voltage Vthr in the autozero operation period. In the amplifying period, the outputs increase over time in accordance with the polarity and level of the voltage difference (Va−Vb) between the input voltages Va and Vb.

Figure 8:
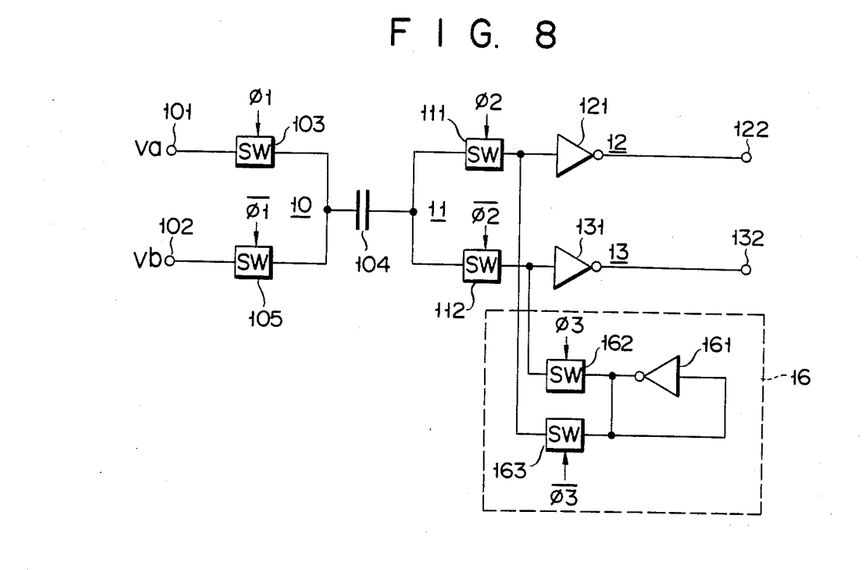
FIG. 8 is a block diagram of an autozeroed comparator according to another embodiment of the present invention.

The present invention is not limited to the embodiment described above. For example, in another embodiment of the present invention shown in FIG. 8, the input and output terminals of an inverter 161 having the same characteristics as those of the inverters 121 and 131 can be short-circuited to obtain an operating voltage V0. The operating voltage V0 is supplied to the input terminal of the inverter 131 through a seventh switch 162 which is controlled by a third clock signal $\phi 3$. Alternatively, the operating voltage V0 may be supplied to the input terminal of the inverter 121 through an eighth switch 163 which is controlled by an inverted signal $\overline{\phi 3}$ of the third clock signal $\phi 3$. Note that, in this case, the inverter 161 and the seventh and eighth switches 162 and 163 constitute an operating voltage generating means 16.

Figure 9:
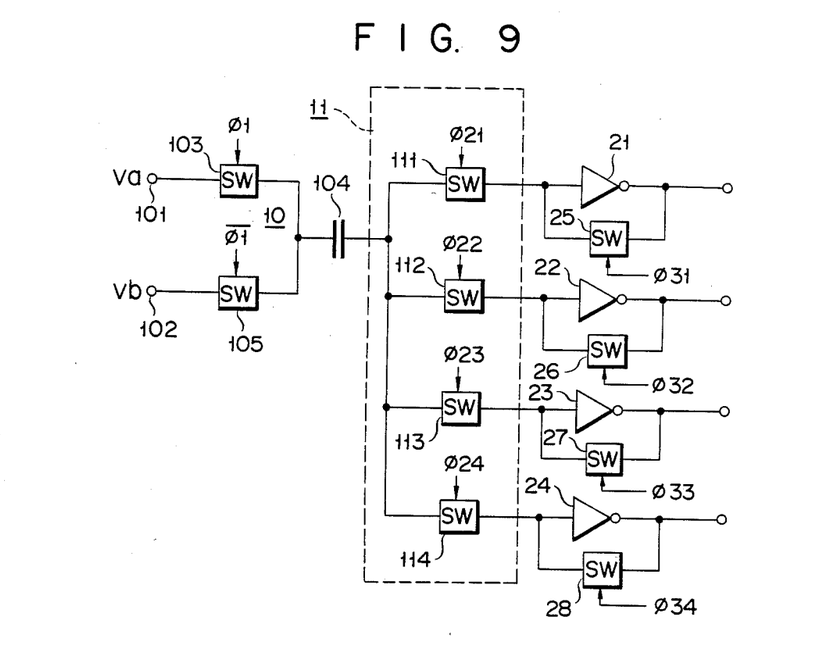
FIG. 9 is a block diagram of an autozeroed comparator according to still another embodiment of the present invention.
Figure 10A:
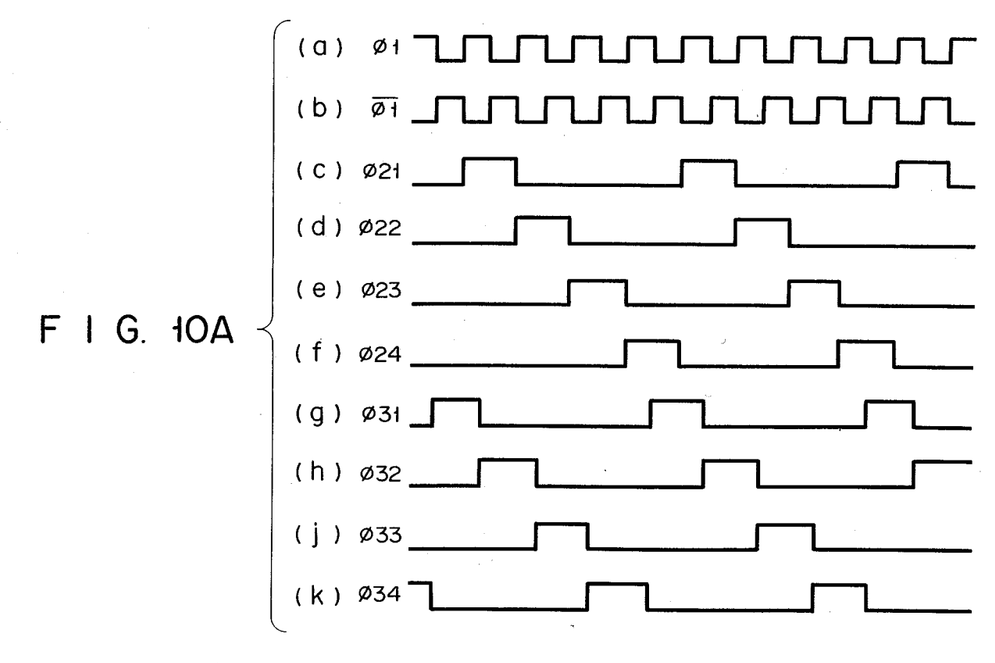
FIGS. 10A and 10B show timing charts (a) to (q) for explaining the mode of operation of the comparator shown in FIG. 9.

The comparator of the present invention may have a configuration as shown in FIG. 9. Referring to still another embodiment shown in FIG. 9, three or more amplifying means 21, 22, 23 and 24 are connected in parallel with each other. A voltage difference (Va−Vb) between input signals Va and Vb is sequentially supplied to the amplifying means 21, 22, 23 and 24 through the alternate switch means 11. The first and second switches 103 and 105 of the input voltage sampling means 10 are driven by a first clock signal ((a) and (b) in FIG. 10A). Respective switches 111, 112, 113 and 114 of the alternate switch 11 are driven by four second clocks $\phi 21$, $\phi 22$, $\phi 23$ and $\phi 24$ ((c) to (f) in FIG. 10A). Selection outputs from the alternate switch means 11 are supplied to the amplifying means 21, 22, 23 and 24. The respective amplifying means 21, 22, 23 and 24 comprise inverters. Operating point setting means 25, 26, 27 and 28 comprising switches are inserted between the input and output terminals of the respective amplifying means 21, 22, 23 and 24. The switches of the operating point setting means 25, 26, 27 and 28 are driven by four-phase third clock signals $\phi 31$, $\phi 32$, $\phi 33$ and $\phi 34$ ((g), (h), (j) and (k) in FIG. 10A).

Figure 10B:
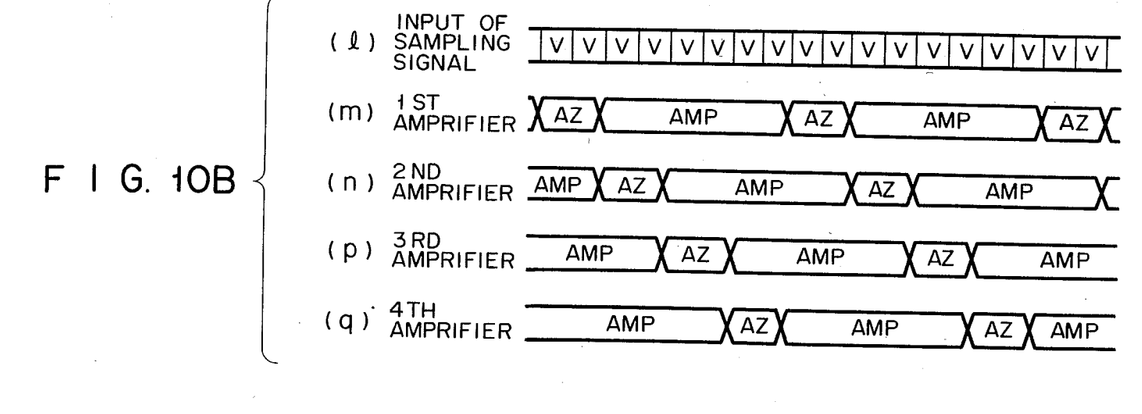

With the comparator having the configuration as described above, the sampling input ((1) in FIG. 10B) is sequentially supplied to the respective amplifying means 21, 22, 23 and 24, so that the three-clock period becomes the amplifying period (AMP) while the one-clock period becomes the autozero period (AZ), as shown in (m) to (q) in FIG. 10B. Accordingly, the effective amplifying period can be prolonged by six times. If the amplifying period is to remain the same, the sampling period can be one-sixth. In this embodiment, comparison outputs are time-divisionally produced from a plurality of amplifying means. When the amplifying output is stabilized and a plurality of outputs from the comparators are multiplexed upon establishment of the comparison result, that is, at the end of the amplifying period, a logic output corresponding to the sampling frequency can be obtained on a single output line. In order to stabilize the amplified output, the following circuit configuration, for example, may be adopted. The amplified output is supplied to an inverter. A feedback inverter is connected in an inverted parallel manner to the inverter so as to stabilize the output to a positive or negative logic level.

Figure 11:
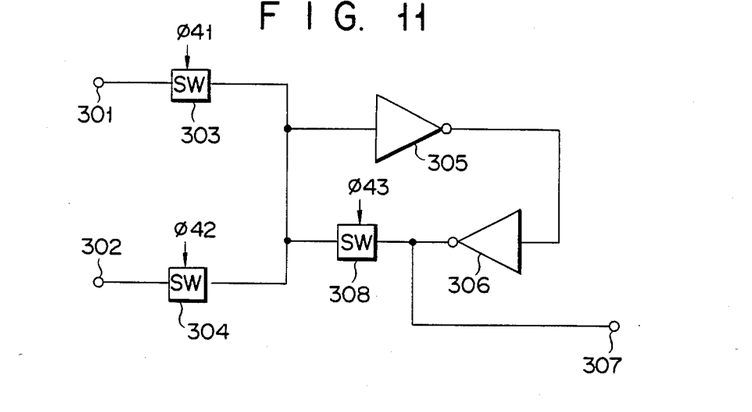
FIG. 11 is a block diagram of an output circuit for synthesizing outputs from comparators according to the present invention.
Figure 12:
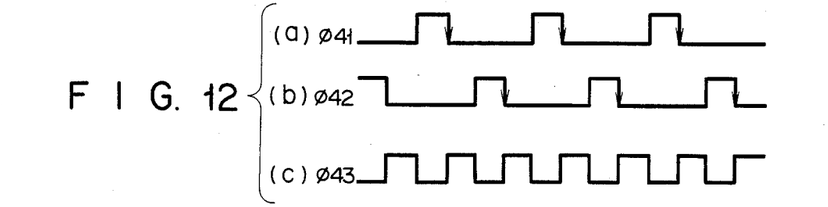
FIG. 12 shows timing charts (a) to (c) for explaining the mode of operation of the output circuit shown in FIG. 11.

FIG. 11 is a block diagram of an output circuit of this type. Input terminals 301 and 302 receive the comparison outputs from the output terminals 122 and 132 shown in FIG. 4. The input terminals 301 and 302 parallel-supply the input signals to an inverter 305 through switches 303 and 304, respectively. Output from the inverter 305 is inverted again by an inverter 306 with the inverted signal produced from an output terminal 307. A switch 308 is inserted between the output terminal 307 and the input terminal of the inverter 305. Switches 303, 304 and 308 are driven by clock signals $\phi 41$, $\phi 42$ and $\phi 43$ as indicated by the timing charts shown in (a) to (c) in FIG. 12. Clock signals $\phi 41$ and $\phi 42$ have the same duty cycle as that of the clock signal $\phi 43$ and have a period twice that thereof. When the switches 303 and 304 are turned off at the trailing edges of the clock signals $\phi 41$ and $\phi 42$, a positive feedback circuit consisting of the inverters 305 and 306 operates simultaneously with the turning on of the switch 308. Thus, a comparison output positively fed back to the logic level is multiplexed and the multiplexed output appears at the output terminal 307.

Figure 13:
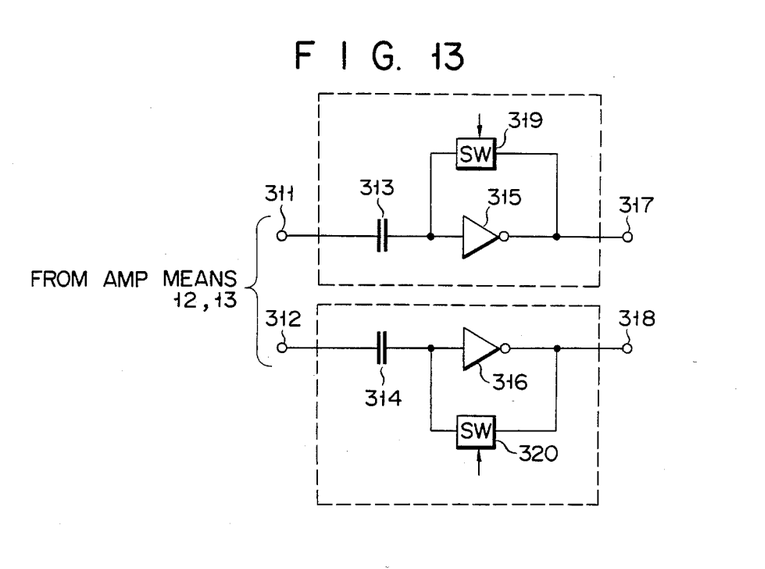
FIG. 13 is a block diagram of an amplifying means connected in series with the output terminal of a comparator of the present invention.

In the embodiment shown in FIG. 4, only one amplifying stage is incorporated. However, a plurality of series-connected amplifying stages may be incorporated to obtain a higher gain. FIG. 13 is a block diagram of such amplifying means. Input terminals 311 and 312 receive the comparison outputs from output terminals 122 and 132 shown in FIG. 4. The input terminals 311 and 312 are connected to the input terminals of inverters 315 and 316 through capacitors 313 and 314, respectively. Switches 319 and 320 are inserted between the input and output terminals of the inverters 315 and 316, respectively. The switches 319 and 320 produce outputs from the inverters 315 and 316 through output terminals 317 and 318, and set the operation point by an autozero operation.

When a parallel A/DC is to be constructed using an autozeroed comparator of the present invention, comparison outputs from a plurality of parallel-connected comparators are encoded by an encoder for conversion into a digital signal of a plurality of bits.

What is claimed is:

1. An autozeroed comparator comprising:
   input voltage sampling means for alternately supplying two input voltages to be compared to one terminal of a capacitor so as to obtain a voltage difference between the two input voltages at the other terminal of said capacitor;

alternate switching means for switching an output from said input voltage sampling means at a period which is longer than at least twice a sampling period;

amplifying means for amplifying an output sequentially supplied from said alternate switching means; and operating point setting means for setting an input level of said amplifying means at an operating point voltage.

2. The autozeroed comparator according to claim 1, wherein said operating point setting means short-circuits input and output terminals of said amplifying means comprising an inverter.

3. The autozeroed comparator according to claim 1, wherein said operating point setting means supplies the operating point voltage externally supplied to an input terminal of said amplifying means.

4. The autozeroed comparator according to claim 4, wherein input and output terminals of an inverter having identical characteristics to characteristics of an inverter of said amplifying means are short-circuited to obtain the operating point voltage.

5. The autozeroed comparator according to claim 1, wherein said amplifying means comprises a plurality of series-connected amplifiers.

6. The autozeroed comparator according to claim 1, further including second amplifying means and wherein said alternate switching means performs a switching operation during a period which is twice as long as the sampling period of said input voltage sampling means to deliver an output to either one of said amplifying means.

* * * * *